United States Patent [19]

Stein

[11] Patent Number: 4,750,836

[45] Date of Patent: Jun. 14, 1988

[54] METHOD OF MEASURING MISALIGNMENT BETWEEN SUPERIMPOSED PATTERNS

[75] Inventor: Philip G. Stein, Pennington, N.J.

[73] Assignee: RCA Corporation, Princeton, N.J.

[21] Appl. No.: 909,023

[22] Filed: Sep. 18, 1986

[51] Int. Cl.$^4$ ............................................. G01B 11/00
[52] U.S. Cl. .................................. 356/399; 356/400; 356/401
[58] Field of Search ......................... 356/399, 400, 401

[56] References Cited

U.S. PATENT DOCUMENTS

| | | | |
|---|---|---|---|
| 2,081,936 | 6/1937 | Keenan | 88/56 |
| 3,621,582 | 11/1971 | Radencic | 33/184.5 |
| 3,748,043 | 7/1973 | Zipin | 356/396 |
| 3,798,782 | 3/1974 | Lindahl | 33/184.5 |
| 4,388,386 | 6/1983 | King et al. | 430/5 |
| 4,481,533 | 11/1984 | Alzmann et al. | 358/101 |
| 4,529,314 | 7/1985 | Ports | 356/375 |

Primary Examiner—Bruce C. Anderson
Attorney, Agent, or Firm—William Squire; Fred Jacob

[57] ABSTRACT

A first pattern of circular indicia of the same diameter and of equal spacing is superimposed with an overlapping second pattern of circular indicia of the same diameter as the first pattern indicia. The indicia of the second pattern are in progressively larger spacings in mirror image relation to a central reference indicia. Measurement indicia are adjacent to each indicia of the second pattern. Observation of the most closely aligned indicia of the first and second patterns and the measurement indicia corresponding to that most closely aligned indicia gives a quick visual measurement of the magnitude of the misalignment.

7 Claims, 2 Drawing Sheets

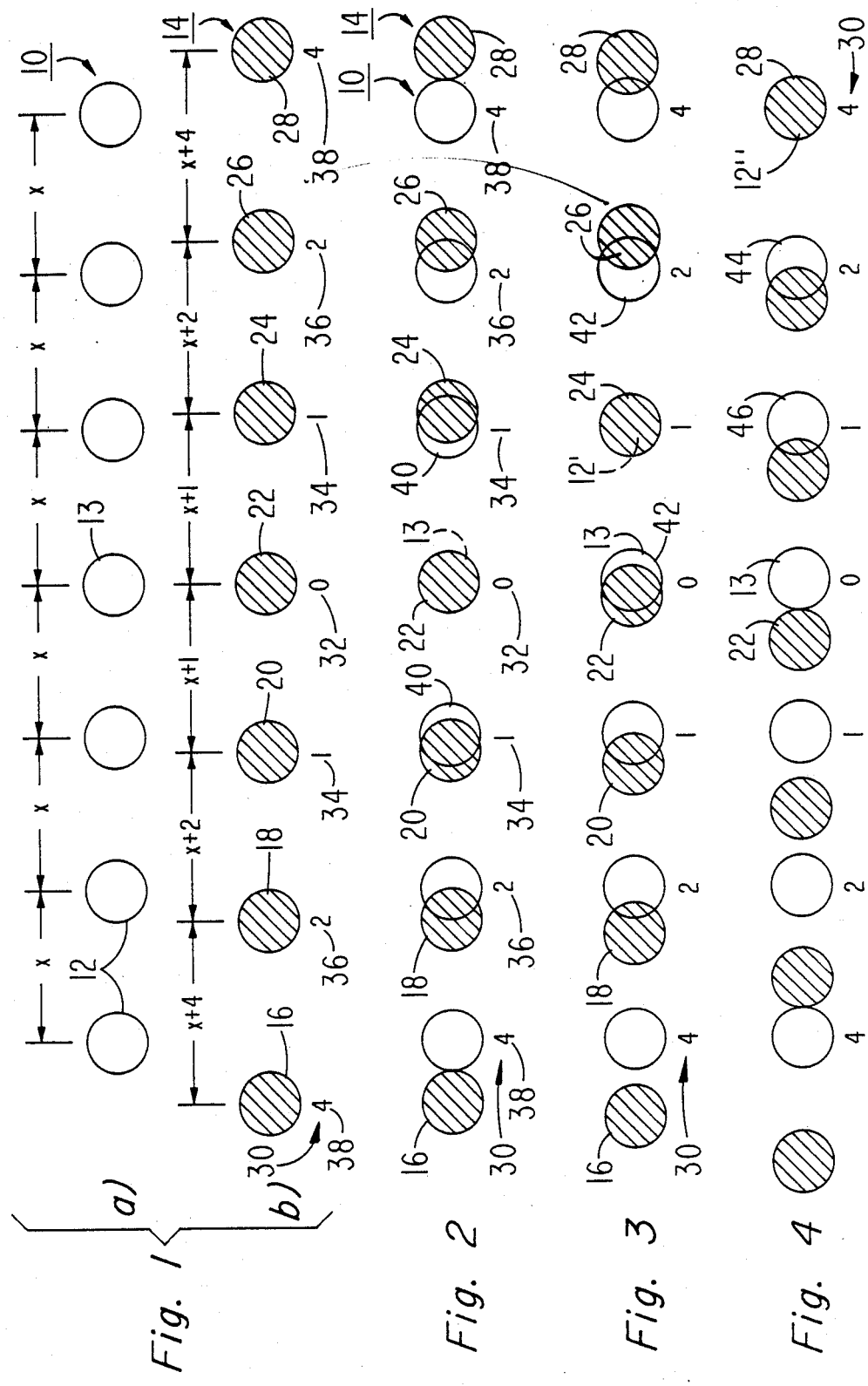

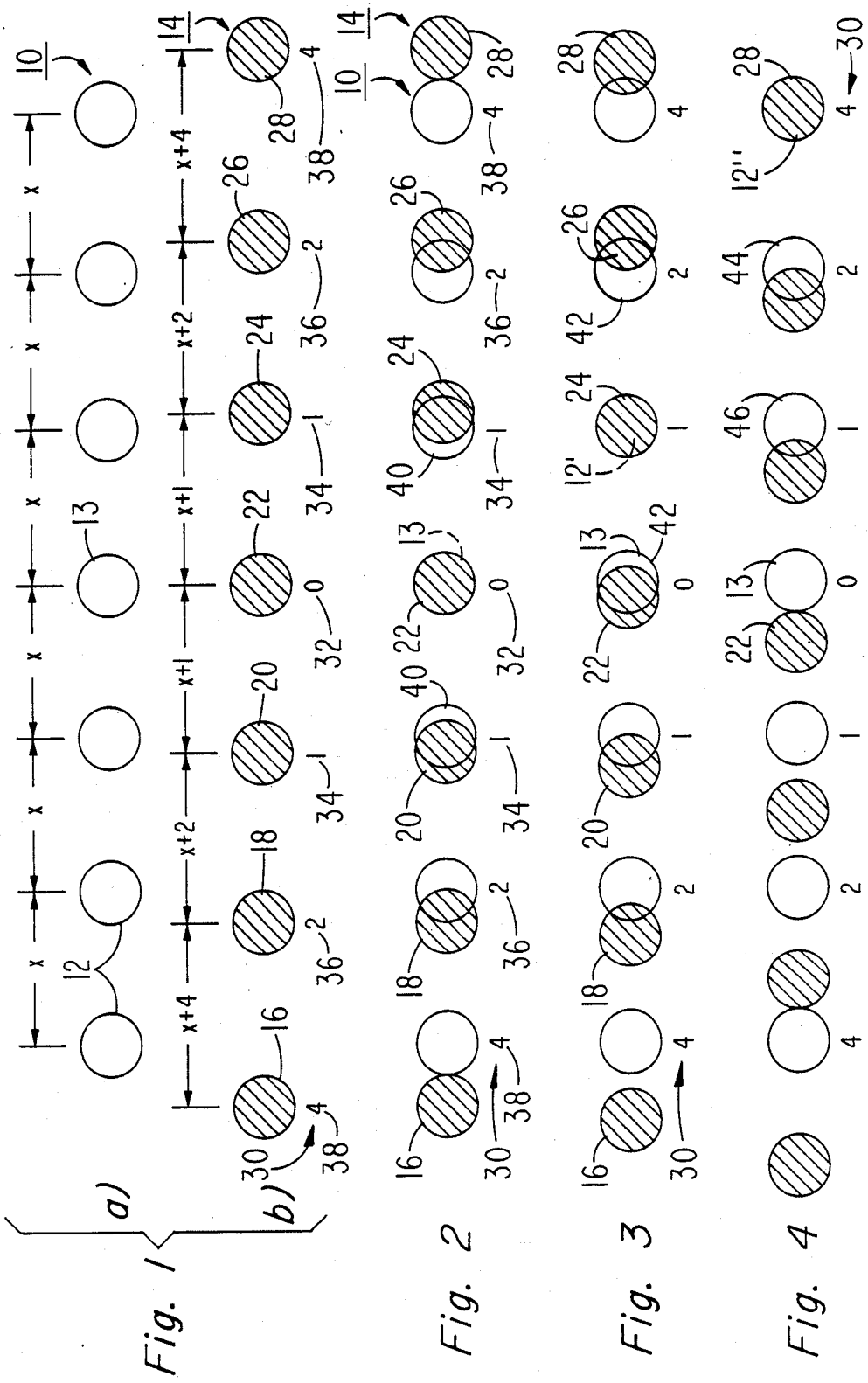

METHOD OF MEASURING MISALIGNMENT BETWEEN SUPERIMPOSED PATTERNS

This invention relates to a method for measuring misalignment between superimposed patterns, and, more particularly, to visually measuring such misalignment.

Techniques for measuring misalignment between superimposed patterns on a substrate are generally known. U.S. Pat. No. 4,529,314 is an example of one such technique. As disclosed therein, the numerical position relative to a reference indicia of two most nearly aligned overlapping indicia on two separate levels is multiplied by the difference in spacing of the indicia of the patterns on the two levels to determine the degree of misalignment of the levels. More particularly, a pattern on one of the levels includes an array of indicia of a given spaced interval. A second array of indicia representing a second pattern superimposed over the first pattern has a second spaced interval which is different than the first interval value. To determine the magnitude of the misalignment, the interval difference between the two indicia spacings is known and is mentally multiplied by the number of indicia of overlap from a reference indicia of each pattern which normally would be aligned and overlapped.

In addition to requiring a mental calculation, the disclosed method provides an array of indicia of equal spacings of a given difference in value. If the spacing intervals of the two indicia arrays are large then the sensitivity of the measurement is coarse. If the difference in values of the two sets of intervals are small, then sensitivity is increased accordingly. However, to measure large values in difference in alignment employing a high sensitivity requires a relatively large array of indicia. Since the use of measuring indicia on a substrate is incidental to the primary purpose of the substrate, such measuring indicia wastes real estate of the substrate and can be costly if made relatively large.

A method according to the present invention which minimizes the amount of substrate region employed but yet provides a measurement of misalignment of relatively high sensitivity includes forming in a first pattern an aligned array of first indicia spaced in substantially equal spacings where one of the indicia represents a first reference. In a second pattern an aligned array of second indicia is formed spaced in unequal spacings of progressively increasing values from a given indicia which is identified as a second reference. The second pattern is superimposed over the first pattern in overlapping relation with the first and second reference indicia being aligned when the patterns are aligned. That indicia of the first pattern which is most closely aligned with an overlapping indicia of the second patter is observed and the value of misalignment of the two patterns is determined by observing the value of the spacing of that most closely aligned indicia of the second pattern.

In the drawing:

FIGS. 1a and 1b respectively illustrate first and second patterns of indicia in accordance with one embodiment of the present invention, the patterns, when in use, normally overlapping; and FIGS. 2, 3, and 4 illustrate different implementations of the overlapping patterns of FIGS. 1a and 1b illustrating different degrees of misalignment in accordance with the one embodiment.

In FIG. 1a, a first pattern 10 of indicia 12 comprises a linear array of circles of equal diameter and equal center-to-center x spacings. One of the indicia of pattern 10, preferably a central indicia 13, is a reference. In FIG. 1b, a second pattern 14 of indicia 16-28 includes a linear array of circles of the same diameter as the indicia 12. A central indicia 22 of pattern 14 serves as a reference.

The center-to-center spacing of the indicia of pattern 14 are different than the x spacing of the pattern 10 indicia and also progressively increase in magnitude from the reference indicia 22. The next adjacent indicia 20 and 24 on either side of reference indicia 22 are equally spaced from indicia 22 the same spacing which is larger than the x spacing of pattern 10. For example, the spacing of indicia 22 to indicia 20 and to indicia 24 may be distance $x+1$. The unit 1 in this case is representative of a convenient length measurement. This length may be measured in, for example, mils or submils or any other length measurement which may be a fraction of the x spacing.

The center-to-center spacing of the next adjacent indicia 18 from indicia 20 and the next adjacent indicia 26 from indicia 24 are the same but are of greater magnitude than the $x+1$ spacing. For example, the spacing of indicia 18 from india 20, which is identical to the spacing of indicia 24 from indicia 26, may be $x+2$. The spacing of the next adjacent indicia 16 from indicia 18 and indicia 28 from indicia 26 is larger than the next previous $x+2$ indicia spacing and may be $x+4$. The incremental increase in magnitude of the spacings 1, 2, 4 and so forth, is merely by way of example, as these could be of any value as long as they differ in increasingly larger magnitudes in a direction away from the reference indicia. These different spacing values between adjacent indicia as they progressively increase in distance and value from the reference indicia 22 provide a logarithmic sensitivity to the misalignment, as will become clearer below.

The indicia of pattern 14 are cross hatched to distinguish the indicia of the pattern 10, FIGS. 1b and 1a, respectively. In FIGS. 1a and 1b, an array of seven indicia are given. However, the arrays may comprise more or fewer indicia in accordance with a given implementation.

In FIG. 1b, a set of alignment measurement indicia 30 correspond to and are adjacent the indicia of pattern 14. The reference indicia 22 has an adjacent measurement indicia 32 which may be a 0, by way of example. Indicia 20 and 24 next adjacent to the reference indicia 22 each have the same identifying measurement indicia 34 which may be a 1. Indicia 34 represent the in cremental increase in the spacing $x+1$ of the indicia 20 and 24 from reference indicia 22 over the equal x spacing of the pattern 10, FIG 1a. Thus, indicia 34 give a visual identifying measurement of the differential increase in the spacing of indicia 20 and 24 from the reference indicia 22 as compared to the corresponding spacing of the indicia of pattern 10. Measurement indicia 36 is adjacent to the indicia 18 and 26 of pattern 14. Measurement indicia 36 may be the number 2 to represent the incremental difference between the spacing of indicia 18 and 20 to the x spacing of pattern 10. Measurement indicia 38, which may be the number 4, is placed adjacent the indicia 16 and 28. The measurement indicia 38 may represent the incremental increase of spacing of the indicia 16 and 18 from the x spacing of pattern 10.

Normally the pattern 10 of indicia are part of a larger pattern which is to be aligned with a second normally larger pattern which includes the pattern 14. For example, the pattern 10 may represent the alignment of copper conductors on a printed circuit board that are on a dielectric substrate. The pattern 14 of FIG. 1b may represent the alignment of holes punched through the board and are part of a larger pattern of holes which are punched through the copper conductor pattern on the printed circuit board. The punched holes that are placed relative to the copper conductors are required to be aligned with those conductors for receiving leads of components which are to be soldered to the copper conductor pads corresponding to a given hole. If the holes are misaligned with the copper conductors, then the leads may not be soldered properly or not soldered at all due to the absence of the adjacent copper conductor. It is critically important in printed circuit board manufacture, therefore, that the holes punched through the board are aligned with the mating copper conductors.

The pattern 10 may be etched into the copper conductor material of the printed circuit board simultaneously with the etching of the remaining copper pattern so as to form a single large pattern on the board including the indicia of pattern 10. The holes punched through the printed circuit board are punched by a set of dies which have a given fixed relative alignment. The pattern 14 is formed with an additional set of dies which have a fixed alignment with the alignment of the remaining dies. Thus, any misalignment of the holes created by the punches will be represented by the misalignment of the pattern 14 relative to the pattern 10.

In FIG. 2, it is assumed that the hole pattern represented by pattern 14 is aligned exactly with the copper conductor pattern represented by pattern 10. The reference indicia 13 of pattern 10 has been completely punched out by the reference indicia 22 of pattern 14. These reference indicia can be readily visually observed by the identifying measurement indicia 32, the number 0. The indicia 20 and 24 next adjacent to the reference indicia are identified by the identifying indicia 34, the number 1. After the pattern 14 is punched through the pattern 10, the remaining pattern 10 indicia at the identifying indicia 34 are crescents 40. The crescents 40 face in opposite directions and are of equal area. The area and shape of the crescents 40 can be readily visually observed. Further, the comparison of the areas can also be readily visually observed and, in combination with observation that none of indicia 13 of the pattern 10 remains is indicative of exact alignment of pattern 14 with pattern 10. In the above instance, the reference measuring indicia 32, the number 0, indicates immediately to an observer that the two patterns are exactly aligned by the fact that none of pattern 10 is observed next to the measuring indicia 32 and it is central to the adjacent crescents 40 of equal area and shape facing in opposite directions. As a further verification of the exact alignment, the remaining pattern 10 and 14 indicia are progressively misaligned by larger values of symmetrical equal area regions facing in opposite directions as represented by the crescents adjacent measurement indicia 36. The amount of misalignment of the patterns 10 and 14 at the different measuring indicia 3 and 38 is exaggerated for purpose of illustration.

An important factor in providing the increasing difference in magnitude of the spacing of the indicia of pattern 14 relative to the equal spacing of the indicia of pattern 10 is that the system exhibits different degrees of sensitivity. In FIG. 1b, by making the spacing of indicia 20 and 24 from the reference indicia 22 different by a relatively small value, high sensitivity is provided. That is, misalignment to that small 1 unit value can be easily observed by the indicia next adjacent to the reference indicia. The smaller the x+1 difference in the spacing of the pattern 14 indicia from the reference indicia 22 as compared to the x spacing of the indicia of pattern 10, the greater the sensitivity.

Increasing the indicia 18 and 26 x+2 spacing to a larger value over the x+1 spacing decreases its sensitivity by a factor of two. A further increase in the x+4 spacing of indicia 16 from the next adjacent indicia 18 and indicia 28 from the next adjacent indicia 26 provides, in this example, a four-fold decrease in sensitivity of misalignment of the patterns 10 and 14.

In FIG. 3, for example, the reference indicia 13 and 22 are misaligned. The amount of misalignment is visually observed by observing which of the indicia of the two patterns are most closely aligned. Indicia 24 of pattern 14 is most closely aligned with indicia 12' of pattern 10. Two crescents 42 of different areas facing in opposite directions are observed in the next adjacent indicia of patterns 10 and 14. The visual measurement of the amount of misalignment is immediately observed by observing the measuring indicia 30 of the most closely aligned indicia 12' and 24. In this case, assuming a hole is punched through a printed circuit board, as discussed above, none of the pattern of indicia 12' is observed adjacent the hole formed by indicia 24. The measuring indicia 30, the number 1, adjacent the completely punched-out indicia 12' gives an immediate visual measurement of the magnitude of the misalignment. In this case, the misalignment is one unit or if 1 represents mils, 1 mil.

In FIG. 4, it is assumed that the misalignment is a magnitude of four units. Indicia 12" of pattern 10 is most closely aligned with and overlaps the indicia 28 of pattern 14. Where indicia 28 is a hole, indicia 12" is completely punched out. The next adjacent indicia have crescents 44 and 46 of symmetrical shape but of different areas which face in the same direction. The measuring indicia 30, number 4, gives a visual indication of the magnitude of the misalignment, in this case, four units or where the units represent mils, 4 mils. By making the spacing between adjacent indicia of the pattern 14 of progressively larger magnitudes, relatively fewer indicia may be employed to provide a large variation in sensitivity in measurement with a corresponding variation in maximum range. This provides a high sensitivity where needed and a large range capability to identify the nature of large errors.

The example illustrated herein represents a difference in sensitivity of 1-4 units or mils. In practice, however, the difference can be of any value, for example, 1-10, 40 or 50 units or any other value, as may be desired. While seven indicia are employed in each of the patterns 10 and 14, the number of indicia in practice may be fewer or greater. The close relationship of the magnitudes of the difference in spacing of the indicia 14 from 1-2 to 4 mils is only by way of illustration. As is apparent, the difference in spacing may be 1, 10 and 30 mils, for example. The 1 mil spacing differential provides the sensitivity to 1 mil. The 10 mil differential can provide a sensitivity to 10 mils and so forth, employing only seven indicia. Thus, relatively little physical area of a substrate is used to provide the visual measurement.

Further, the measurement indicia 30 gives an immediate measurement indication by visual observation of the magnitude of the misalignment. It is readily apparent that should none of the indicia of patterns 10 and 14 be linearly aligned exactly, then the amount of misalignment can be determined by interpolation. In that case, the adjacent crescents of the misaligned indicia that are of the smallest area and which face in opposite directions represent the closest measurement of the value of misalignment.

In FIG. 2, if the patterns 10 and 14 were misaligned so that none of the indicia were aligned exactly, then symmetrical crescents, such as crescents 40 of the same or different areas, would appear in next adjacent indicia rather than spaced from each other with an intervening aligned indicia, as shown. The value of measurement of the misalignment can be visually made by interpolating the difference in area of the two facing crescents relative to the adjacent measuring indicia 30 corresponding to those two adjacent crescents. For example, if the two adjacent crescents 40 were facing in opposite directions at adjacent measurement indicia, assuming the measurement indicia 32 and 34 correspond to those two adjacent crescents, then a proportional interpolation of the difference in areas of the opposite facing two crescents correspond to an equal proportional difference in value of the measurement indicia 32 and 34. The same kind of interpolation can be taken between any set of adjacent indicia to provide a relatively accurate measure of the value of the misalignment magnitude.

The use of circular indicia is advantageous because the resulting crescents provide a readily observable indication of the location and magnitude of closely misaligned indicia when there is no exact indicia alignment. The back-to-back facing of adjacent crescents is an immediate reference identification as to the location of the misalignment value as indicated by indicia 30. It is also preferable that the indicia of patterns 10 and 14 be of the same diameter circles to provide an immediate observation of misalignment by the appearance of a crescent in the misaligned indicia.

Further, should the crescents be asymmetrical relative to an axis through the centers of the circular indicia, immediate visual indication of angular misalignment is given. For example, if the line of indicia of pattern 14 intersected the line of indicia of pattern 10 rather than superimposed parallel, then the crescents will appear asymmetrical. Such asymmetry is an indication of angular misalignment of the two patterns rather than linear misalignment as represented by FIGS. 2-4.

What is claimed is:

1. A method of measuring misalignment between patterns on a substrate comprising:
   forming in a first of said patterns an aligned array of first indicia spaced in substantially equal spacings;
   identifying one of said indicia in said first pattern as a first reference;
   forming in a second of said patterns an aligned array of second indicia spaced in unequal spacings of progressively increasing values from a given indicia;
   identifying a given one of said indicia in said second pattern as a second reference;
   superimposing said second pattern over the first pattern in overlapping relation with said first and second reference indicia being aligned when said patterns are aligned to provide a logarithmic vernier;
   observing which indicia of said first pattern is most closely aligned with an overlapping indicia of said second pattern; and
   measuring the value of misalignment of the two patterns by observing the value of the spacing of that most closely aligned indicia of the second pattern.

2. The method of claim 1 wherein said patterns of indicia of unequal spacings of progressively increasing values increase in value in mirror image fashion in opposite directions from said second reference indicia.

3. The method of claim 1 wherein said progressively increasing values differ from adjacent values by a multiplication factor.

4. The method of claim wherein said progressively increasing values differ from adjacent values by a set of multiplication factors of different values.

5. The method of claim 1 wherein said measuring step includes observing measuring indicia adjacent each of said second indicia representing the spacing value of that adjacent second indicia.

6. The method of claim 1 wherein said first pattern includes forming a pattern of electrically conductive elements on said substrate and said second pattern includes forming a plurality of holes in the substrate, said first indicia comprising circular elements and said second indicia comprising circular holes of the same diameter as the circular elements.

7. A method of measuring misalignment between a printed circuit conductor pattern on a substrate and punched holes through the pattern and substrate comprising:
   forming an array of equally spaced circular conductor pads on the substrate simultaneously with the forming of the printed circuit conductor pattern;
   punching an array of circular holes through said substrate simultaneously with the punching of the holes through the pattern, said array of circular holes being arranged in unequal spacings of progressively increasing values from a given hole of that array, said array of holes being superimposed in overlapping relation with the array of pads with one of the pads of the pad array being aligned with the given hole when the holes and pads are aligned to provide a logarithmic vernier;
   observing which hole, when different than the given hole, is most closely aligned with the overlapping corresponding pad; and
   measuring the value of misalignment of the holes to the pads by observing the value of the spacing of that most closely aligned hole.

* * * * *